United States Patent
Ray et al.

(10) Patent No.: US 9,543,028 B2
(45) Date of Patent: *Jan. 10, 2017

(54) WORD LINE DEPENDENT TEMPERATURE COMPENSATION SCHEME DURING SENSING TO COUNTERACT CROSS-TEMPERATURE EFFECT

(71) Applicant: SANDISK TECHNOLOGIES INC., Plano, TX (US)

(72) Inventors: Biswajit Ray, Mountain View, CA (US); Mohan Dunga, Santa Clara, CA (US); Changyuan Chen, San Ramon, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/574,114

(22) Filed: Dec. 17, 2014

(65) Prior Publication Data

US 2016/0086675 A1    Mar. 24, 2016

Related U.S. Application Data

(60) Provisional application No. 62/052,473, filed on Sep. 19, 2014.

(51) Int. Cl.
   *G11C 16/26* (2006.01)
   *G11C 16/04* (2006.01)
   (Continued)

(52) U.S. Cl.
   CPC ............... *G11C 16/26* (2013.01); *G11C 7/04* (2013.01); *G11C 11/5642* (2013.01);
   (Continued)

(58) Field of Classification Search
   None
   See application file for complete search history.

(56) References Cited

U.S. PATENT DOCUMENTS 6,560,152 B1   5/2003   Cernea
7,755,946 B2   7/2010   Dunga
   (Continued)

OTHER PUBLICATIONS

Ray, et al., "Temperature Dependent Sensing Scheme to Counteract Cross-Temperature Threshold Voltage Distribution Widening," U.S. Appl. No. 14/574,110, filed Dec. 17, 2014.

(Continued)

*Primary Examiner* — James G Norman
(74) *Attorney, Agent, or Firm* — Vierra Magen Marcus LLP

(57) ABSTRACT

Methods for reducing cross-temperature dependent word line failures using a temperature dependent sensing scheme during a sensing operation are described. In some embodiments, during a read operation, the sensing conditions applied to memory cells within a memory array (e.g., the sensing time, source line voltage, or bit line voltage) may be set based on a temperature of the memory cells during sensing and a word line location of the memory cells to be sensed. In one example, the memory array may comprise a NAND memory array that includes a NAND string and the sensing time for sensing a memory cell of the NAND string and the source line voltage applied to a source line connected to a source end of the NAND string may be set based on the temperature of the memory cells during sensing and the word line location of the memory cells to be sensed.

20 Claims, 14 Drawing Sheets

(51) Int. Cl.
*G11C 7/04* (2006.01)
*G11C 11/56* (2006.01)
*G11C 16/34* (2006.01)

(52) U.S. Cl.
CPC ...... *G11C 16/0483* (2013.01); *G11C 16/3418* (2013.01); *G11C 16/3427* (2013.01)

(56) References Cited

U.S. PATENT DOCUMENTS

| | | | |
|---|---|---|---|
| 8,213,255 B2 | 7/2012 | Hemink | |
| 8,611,157 B2 | 12/2013 | Dutta | |
| 2007/0177429 A1 | 8/2007 | Nagashima | |
| 2007/0291566 A1* | 12/2007 | Mokhlesi | G11C 7/04 365/212 |
| 2008/0285341 A1* | 11/2008 | Moschiano | G11C 16/3418 365/185.02 |
| 2010/0074014 A1* | 3/2010 | Dunga | G11C 7/04 365/185.17 |
| 2011/0205823 A1 | 8/2011 | Hemink | |
| 2013/0163342 A1* | 6/2013 | Dutta | G11C 16/26 365/185.21 |
| 2013/0322170 A1 | 12/2013 | Goldman | |
| 2014/0269070 A1 | 9/2014 | Hsiung | |
| 2015/0279472 A1* | 10/2015 | Jones | G11C 16/24 365/185.19 |

OTHER PUBLICATIONS

Office Action dated Nov. 25, 2015, U.S. Appl. No. 14/574,110, filed Dec. 17, 2014.
PCT International Search Report and Written Opinion of the International Searching Authority, dated Nov. 18, 2015 PCT Application PCT/US2015/047627.
PCT International Search Report and Written Opinion of the International Searching Authority, dated Nov. 16, 2015 PCT Application PCT/US2015/047800.
Response to Office Action dated Feb. 25, 2016, U.S. Appl. No. 14/574,110, filed Dec. 17, 2014.
Notice of Allowance dated May 3, 2016, U.S. Appl. No. 14/574,110, filed Dec. 17, 2014.
Response to Office Action dated Aug. 3, 2016, U.S. Appl. No. 14/574,110, filed Dec. 17, 2014.
Notice of Allowance dated Sep. 1, 2016, U.S. Appl. No. 14/574,110, filed Dec. 17, 2014.

* cited by examiner

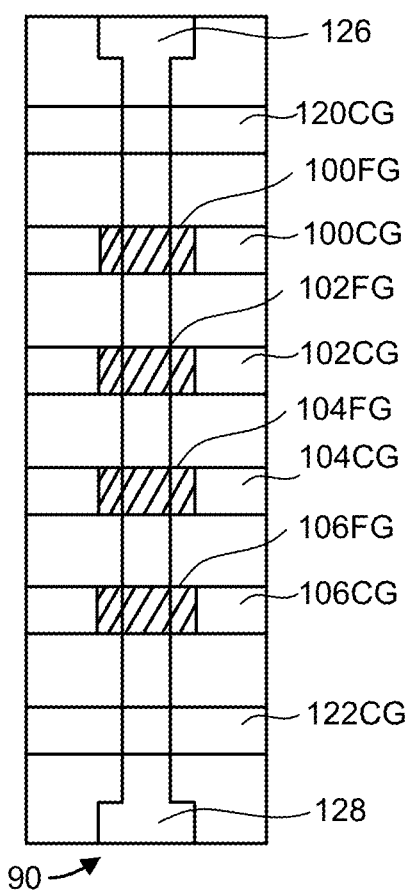
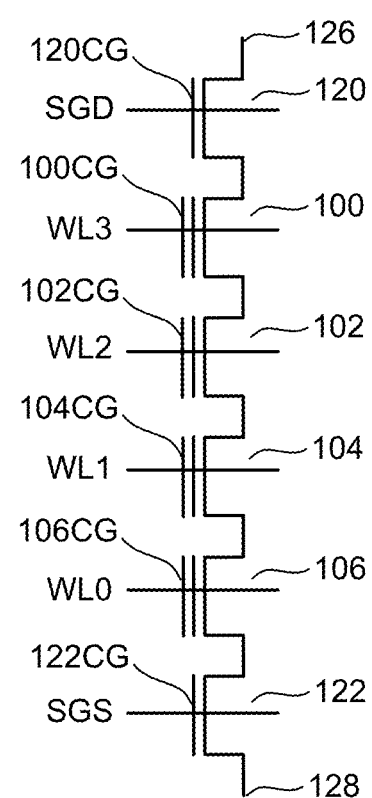
FIG. 1 (Prior Art)
FIG. 2 (Prior Art)

WORD LINE DEPENDENT TEMPERATURE COMPENSATION SCHEME DURING SENSING TO COUNTERACT CROSS-TEMPERATURE EFFECT

CLAIM OF PRIORITY

The present application claims priority to U.S. Provisional Application No. 62/052,473, entitled "Temperature Dependent Sensing Scheme," filed Sep. 19, 2014, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in memory cell characteristics over temperature.

BRIEF DESCRIPTION OF THE DRAWINGS

FIG. 1 depicts one embodiment of a NAND string.

FIG. 2 depicts one embodiment of the NAND string of FIG. 1 using a corresponding circuit diagram.

DETAILED DESCRIPTION

Figure 3A:
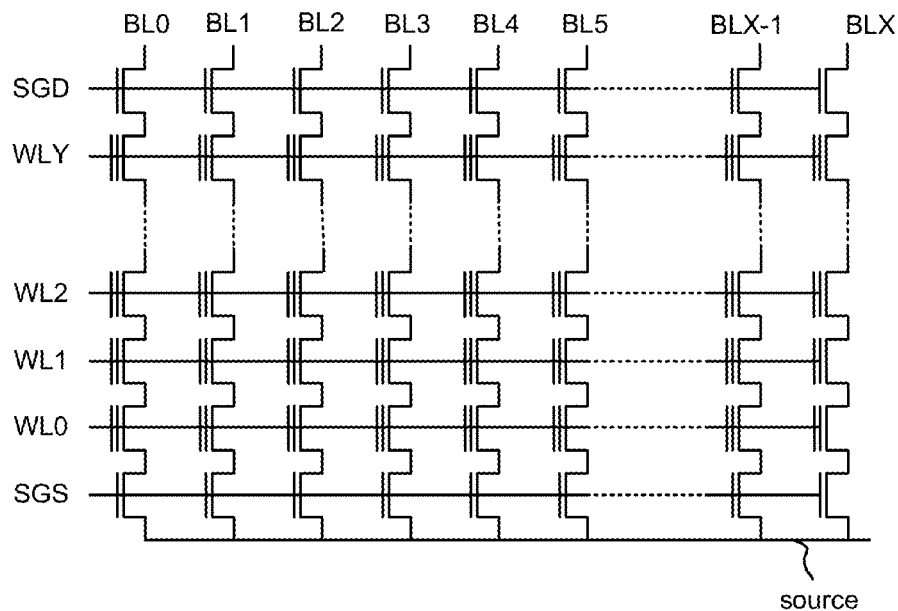
FIG. 3A depicts one embodiment of a memory block including a plurality of NAND strings.

Technology is described for reducing cross-temperature dependent word line failures using a temperature dependent sensing scheme during a read or program verify operation. In some embodiments, during a read operation, the sensing conditions applied to memory cells within a memory array (e.g., the sensing time, the amount of integration capacitance charged or discharged during the sensing time, and the selected bit line voltage applied to a selected bit line during the read operation) may be set and/or adjusted based on a temperature of the memory cells during sensing and a word line location of the memory cells to be sensed (e.g., whether the memory cells are near a source-side end of a NAND string, in a middle section of the NAND string, or near a drain-side end of the NAND string). In one example, the memory array may comprise a NAND memory array (e.g., a vertical NAND memory including vertical NAND strings) that includes a NAND string and the sensing time for sensing a memory cell of the NAND string and the source line voltage applied to a source line connected to a source end of the NAND string may be set based on the temperature of the memory cells during sensing and the word line location of the memory cells to be sensed.

In one embodiment, the word lines within a memory array may be partitioned or divided into a plurality of zones (e.g., partitioned into three different zones). Each zone of the plurality of zones may correspond with a contiguous set of word lines (e.g., word lines 0-15 with word line 0 arranged closest to a source-side select gate of a NAND string). During a read operation, control circuitry in communication with the memory array may identify a plurality of memory cells within the memory array associated with a page to be read (e.g., determined based on a read address provided to the control circuitry), determine a word line zone (or a word line number) associated with a word line connected to the plurality of memory cells, acquire a current temperature of the memory array (e.g., acquire the current temperature via a temperature sensor arranged on the same memory die as the memory array), determine a sensing time for reading the page based on the current temperature and the word line zone (or the word line number), determine a source voltage to be applied to a source line of a NAND string associated with a first memory cell of the plurality of memory cells based on the current temperature and the word line zone (or the word line number), and determine data stored within the page by applying the source voltage to the source line connected to a source end of the NAND string and sampling an integration capacitor electrically connected to the NAND string after the sensing time has passed. In some cases, both the sensing time and the source voltage may be determined based on the current temperature, the word line zone, and a previous temperature associated with when the page was programmed into the plurality of memory cells. The previous temperature may be acquired by reading temperature information (e.g., two bits encoding one of four temperature ranges) stored within the sideband or overhead area located at the end of the page (e.g., within an additional 16 bytes appended to the page).

In some embodiments, the sensing time and the source voltage may be determined based on the current temperature, the word line zone, and the previous temperature, and programmed data states associated with neighboring memory cells of the first memory cell of the plurality of memory cells. In one example, the sensing time may be increased and the source voltage may be decreased if a data state associated with a second memory cell adjacent to the first memory cell is above a particular programming state.

In some cases, cross-temperature threshold voltage distribution widening may be reduced by applying a temperature dependent sensing scheme during read and/or program verify operations. In one embodiment, during a read operation, the sensing conditions applied to memory cells within a memory array (e.g., the sensing time, the amount of integration capacitance charged or discharged during the sensing time, and the read voltage applied to the memory cells during the sensing time) may be set and/or adjusted based on a temperature of the memory cells during the read operation and a previous temperature of the memory cells when the memory cells were programmed. The memory array may comprise a NAND memory array (e.g., a vertical NAND memory including vertical NAND strings) that includes a NAND string. In some cases, the sensing time for sensing a memory cell of the NAND string and the source voltage applied to a source line connected to the NAND string may be set based on the temperature of the memory cells during sensing and the previous temperature of the memory cells when the memory cells were programmed.

In one embodiment, during a read operation, control circuitry in communication with a memory array may identify a plurality of memory cells within the memory array associated with a page to be read (e.g., determined based on a read address provided to the control circuitry), acquire a current temperature of the memory array (e.g., acquire the current temperature via a temperature sensor arranged on the same memory die as the memory array), acquire a previous temperature associated with when the page was programmed into the plurality of memory cells, determine a sensing time for reading the page based on the current temperature and the previous temperature, determine a source voltage to be applied to a source line of a NAND string associated with a first memory cell of the plurality of memory cells based on the current temperature and the previous temperature, and determine data stored within the page by applying the source voltage to the source line connected to a source end of the NAND string and sampling an integration capacitor electrically connected to the NAND string after the sensing time has passed. In some cases, the previous temperature may be acquired by reading temperature information (e.g., two bits encoding one of four temperature ranges) stored within the sideband or overhead area located at the end of the page (e.g., within an additional 16 bytes appended to the page). In some cases, the sensing time and the source voltage may be determined based on the current temperature, the previous temperature, and a previous programming voltage applied to memory cells associated with the page when the page was programmed. The previous programming voltage applied to the plurality of memory cells when the page was programmed may be stored within the sideband or overhead area located at the end of the page.

In some cases, cross-temperature threshold voltage (Vt) distribution widening may present a memory cell reliability concern as the widening of threshold voltage distributions over temperature may lead to overlaps in programming states and/or to increased data read errors. In one example, when memory cells are programmed at a first temperature (e.g., a hot temperature, such as 85 degrees Celsius) and then read at a second temperature (e.g., a cold temperature, such as negative 25 degrees Celsius), then the data stored in the memory cells may not be able to be read back correctly due to the widening of the threshold voltage distributions. To compensate for the cross-temperature threshold voltage distribution widening, sensing conditions (e.g., the sensing reference current, the sensing time, and the amount of integration capacitance used during the sensing time) and NAND string source line biasing conditions may be determined and applied based on a programming temperature (e.g., the temperature of a memory array during a programming operation) and a read temperature (e.g., the temperature of the memory array during a read operation). In one embodiment, a lookup table (e.g., stored in a non-volatile memory) may include sensing times and source line voltages over a range of programming temperatures and read temperatures. In one example, if a page of data was programmed at a hot temperature (e.g., 85 degrees Celsius) and a read operation of the page of data is to be performed at a cold temperature (e.g., negative 25 degrees Celsius), then the sensing time for determining the data values associated with the page of data may be increased and the source line voltage applied to the source line of NAND strings associated with the page of data may be reduced (e.g., causing the overdrive voltage for the source-side select gate to be increased).

Benefits of using a temperature dependent sensing scheme that adjusts both sensing conditions and NAND string source line biasing conditions over temperature include improved data retention, improved data reliability, and lower error rates. In one example, setting both the sensing time for sensing memory cells and the source voltage applied to the source end of NAND strings within a memory array based on the current temperature of the memory cells to be sensed and the previous temperature of the memory cells when the memory cells were originally or last programmed may provide a reduction in cross-temperature threshold voltage distributions. Furthermore, setting the sensing time for sensing memory cells and the source voltage applied to the source end of NAND strings within a memory array based on the current temperature of the memory cells to be sensed and a word line number (or a word line location) of the memory cells to be sensed may provide a reduction in cross-temperature dependent word line failures.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

One architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor (e.g., an integration capacitor) in a sense amplifier. In another example, the conduction current of the selected memory cell allows (or fails to allow) the NAND string that included the memory cell to discharge a voltage on the corresponding bit line. The voltage of the bit line may be measured after a period of time (e.g., after a sensing time during which the bit line has been discharged) to determine whether the bit line has been discharged by a particular amount or not.

Figure 3B:
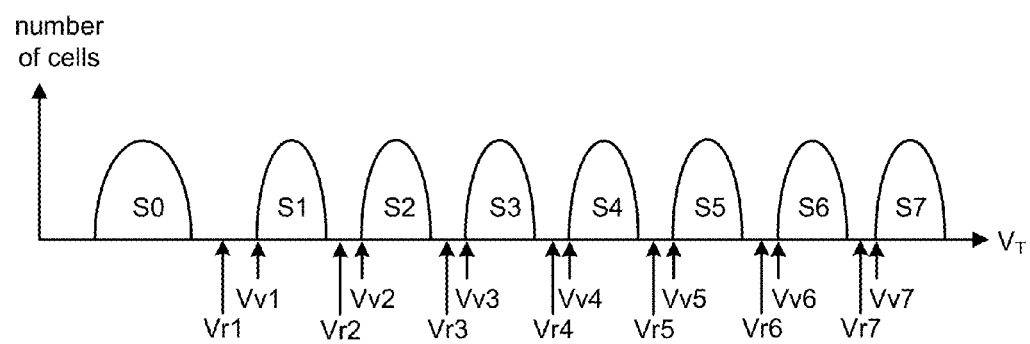
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
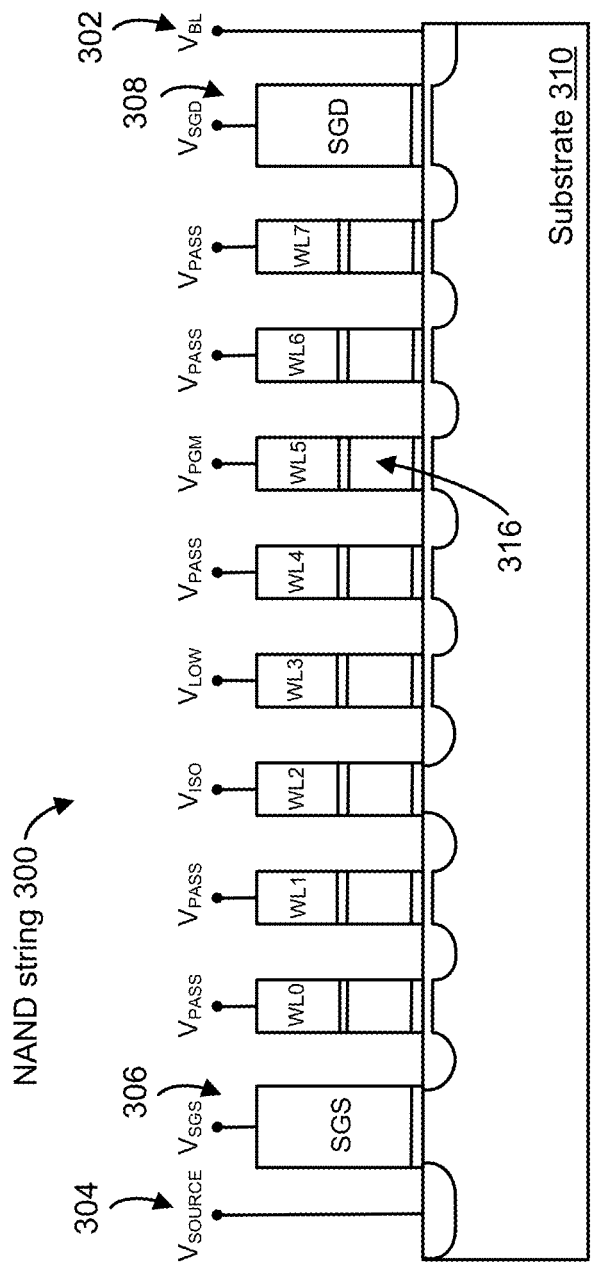
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to $V_{BL}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 3D:
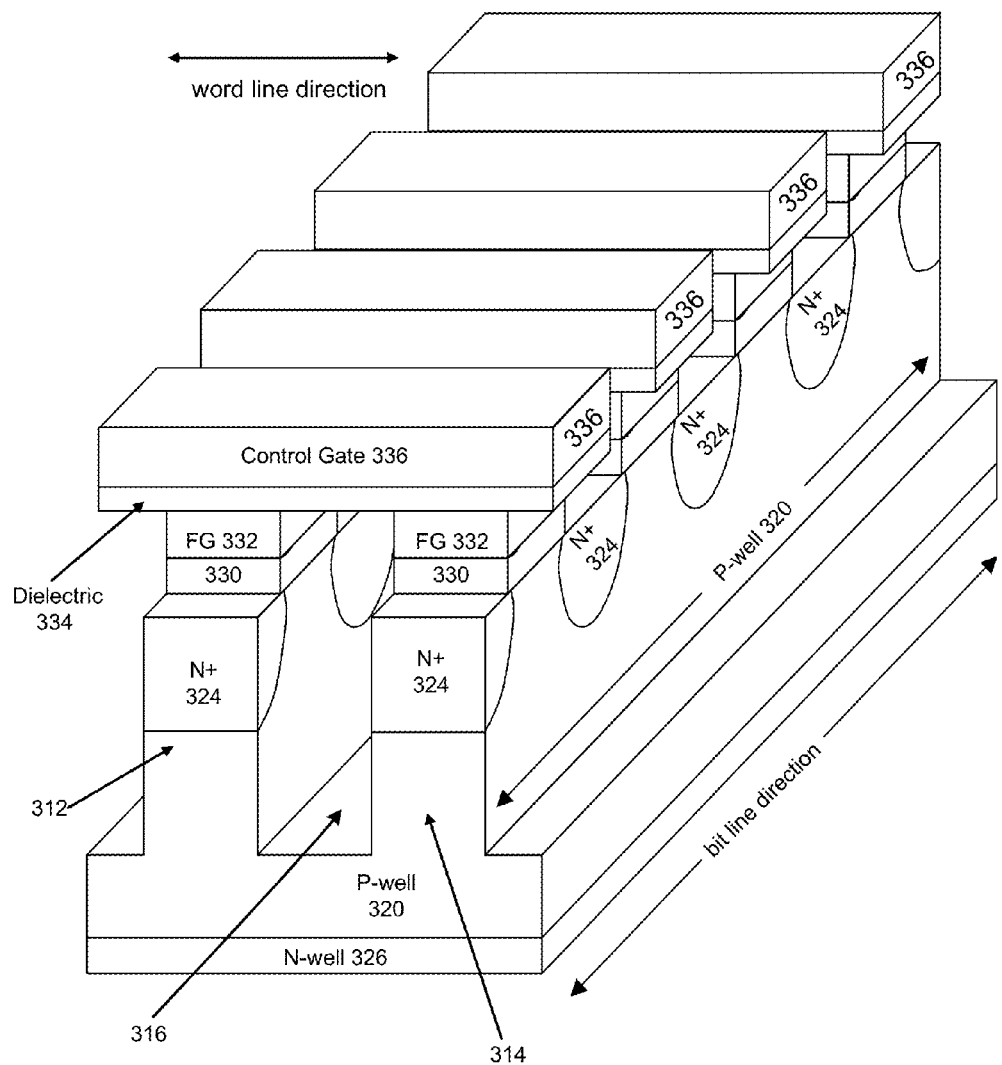
FIG. 3D depicts one embodiment of two NAND strings that may be fabricated as part of a larger flash memory array.

FIG. 3D depicts one embodiment of two NAND strings 312 and 314 that may be fabricated as part of a larger flash memory array. As depicted, NAND strings 312 and 314 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, a bit line associated with a NAND string may run in the bit line direction on top of (or over) the NAND string in a direction perpendicular to the word line direction. In some cases, the N-well 326 may sit in a P-type substrate (not depicted). As depicted, NAND string 312 is separated from NAND string 314 by an isolation region 316. The isolation region 316 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4A:
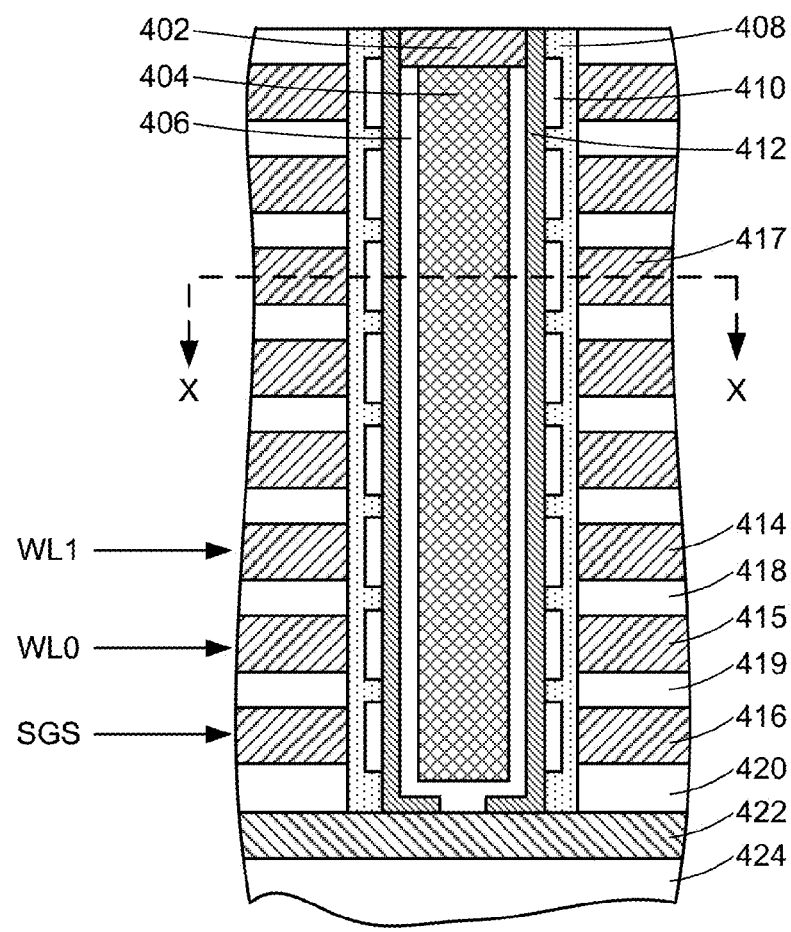
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
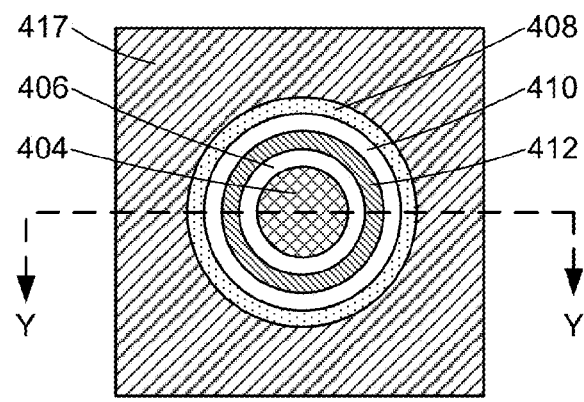
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure. More information regarding 3D NAND structures may be found in U.S. patent application Ser. No. 14/317,274, entitled "Three Dimensional NAND Device with Channel Contacting Conductive Source Line and Method of Making Thereof," filed Jun. 27, 2014.

Figure 5:
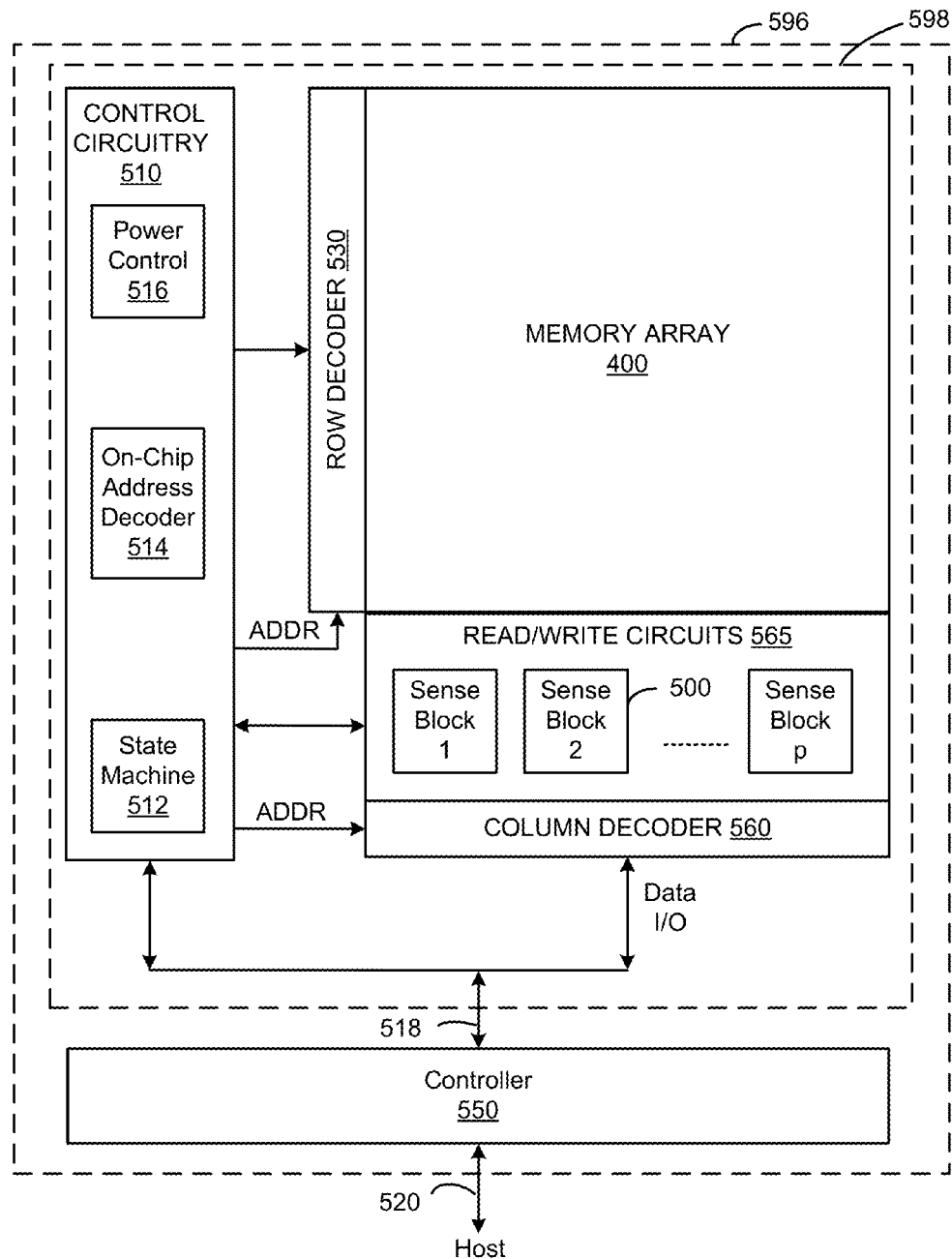
FIG. 5 depicts one embodiment of a non-volatile storage system including read/write circuits for reading and programming a page

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
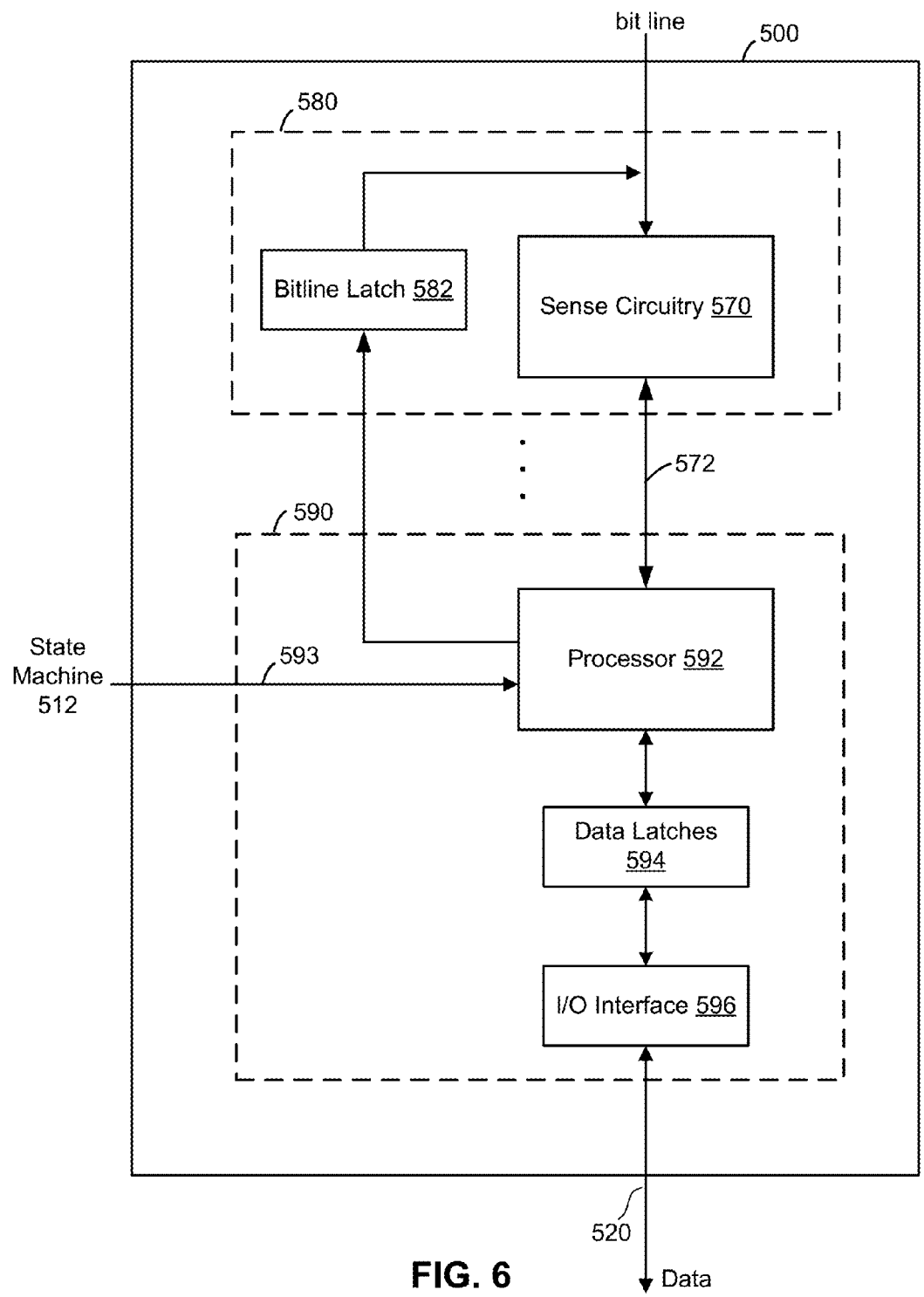
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
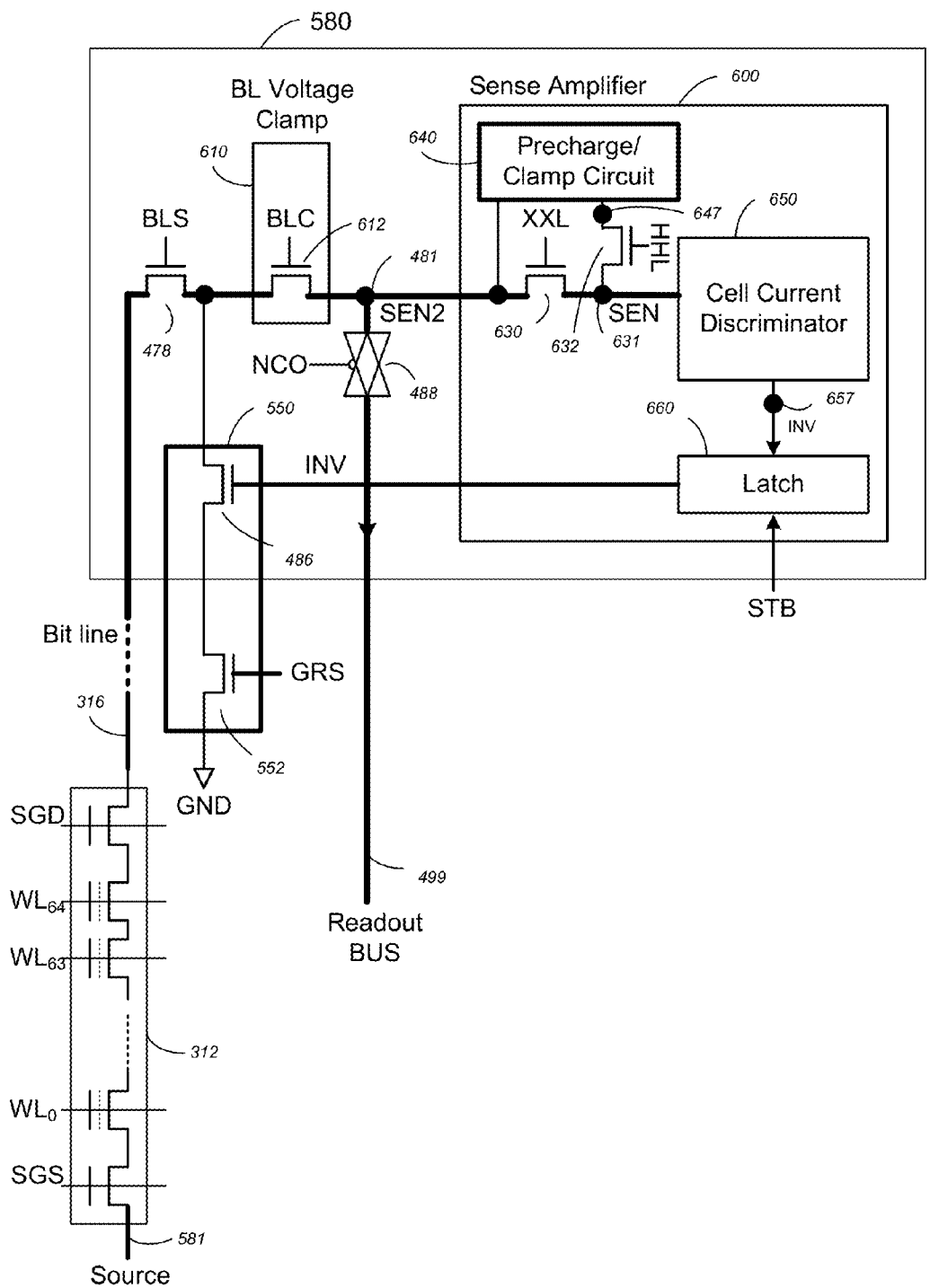
FIG. 7A depicts one embodiment of a sense module.

FIG. 7A depicts one embodiment of a sense module, such as sense module 580 in FIG. 6. As depicted, the sense module may sense the conduction current of a memory cell in a NAND string 312 via a coupled bit line 316. Sense module 580 has a sense node 481 that can be selectively coupled to a bit line, a sense amplifier 600, and a readout bus 499. An isolation transistor 478, when enabled by a signal BLS, connects the bit line 316 to the sense node 481. The sense amplifier 600 senses the sense node 481. Sense amplifier 600 includes a pre-charge/clamp circuit 640, a cell current discriminator 650, and a latch 660. One embodiment of a pre-charge/clamp circuit 640 is described later in reference to FIG. 7B. One embodiment of a cell current discriminator 650 is described later in reference to FIG. 7C.

In one embodiment, sense module 580 controls the voltages and limiting currents applied to bit line 316 and senses the conduction current of a selected memory cell in the NAND string 312. The sense module 580 may include a pull-down circuit 550, which includes transistors 486 and 552, for selectively pulling the bit line 316 to ground. The pull-down circuit 550 is activated when both the signal INV and another signal GRS are both HIGH. The sense module 580 may include a bit line voltage clamp 610, which may clamp the bit line voltage during sensing. Bit line voltage clamp 610 may operate as a source-follower with transistor 612 in series with the bit line 316. BLC may be set to roughly a threshold voltage above the desired bit line voltage (e.g., 0.5V or 0.7V) during sensing. The source 581 of the NAND string 312 may be set to 0V or another bias voltage (e.g., 100 mV) during sensing of the conduction current of the selected memory cell.

Figure 7B:
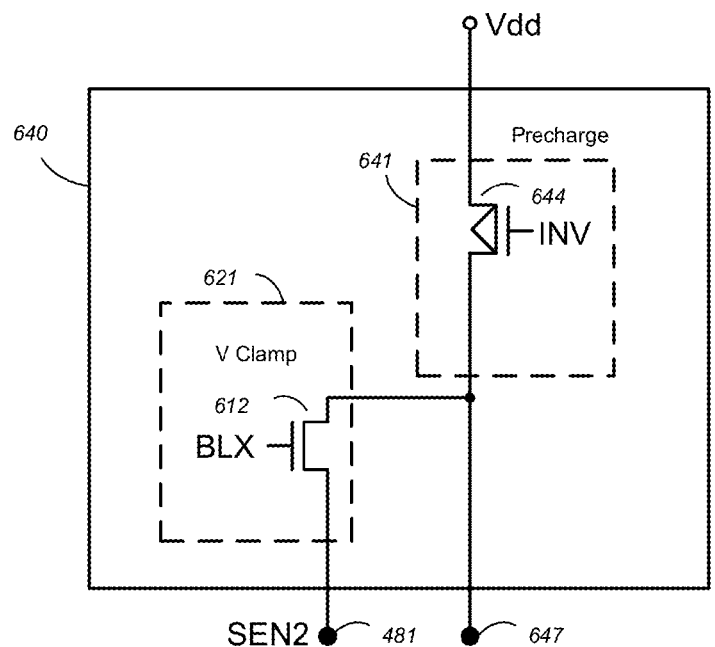
FIG. 7B depicts one embodiment of a pre-charge/clamp circuit.

FIG. 7B depicts one embodiment of a pre-charge/clamp circuit, such as pre-charge/clamp circuit 640 in FIG. 7A. The pre-charge/clamp circuit has a voltage clamp 621 component and a pre-charge circuit 641 component. The voltage clamp 621 is implemented by a transistor 612 controlled by an analog signal BLX at its gate. BLX is such that it ensures sufficient voltage on the node SEN2 481 (see FIG. 7A) so that the bit line voltage clamp 610 can function properly. The pre-charge circuit 641 is implemented by transistor 644 controlled by the signal INV at its gate.

Referring to FIG. 7A, when the selected gate voltage (e.g., a predetermined threshold voltage level) applied to a selected word line is stable, then the conduction current or the programmed threshold voltage of the selected memory cell can be sensed via the coupled bit line 316 via the transistor 630 gated by a signal XXL.

Figure 7C:
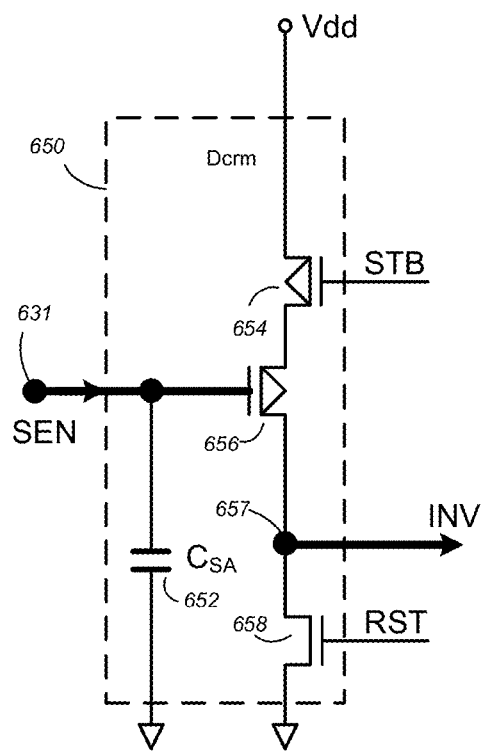
FIG. 7C depicts one embodiment of a cell current discriminator circuit.

FIG. 7C depicts one embodiment of a cell current discriminator circuit, such as cell current discriminator circuit 650 in FIG. 7A. The cell current discriminator 650 serves as a discriminator or comparator of current levels. It is coupled to the sense node to sense the conduction current in the memory cell. Cell current discriminator 650 includes a capacitor 652, p-channel transistor 656, transistors 654 and transistor 658. The cell current discriminator indirectly measures the conduction current of a memory cell by the rate it charges or discharges the capacitor 652. This is accomplished by sensing the signal SEN at the node 631. The signal SEN controls the gate of the p-transistor 656. Prior to sensing, SEN is pre-charged to VDD (HIGH) by the pre-charge circuit 641. Referring to FIG. 7A, the pre-charge is enabled by a signal HHL turning on the coupling transistor 632 so that the node SEN 631 is coupled to the pre-charge circuit 641 at node 647. Sensing is then accomplished by measuring the memory cell's conduction current by the rate it discharges the capacitor 652.

In one embodiment, during sensing, the conduction current of the selected memory cell will discharge the capacitor 652. The voltage of the node SEN will then decrease from VDD at a rate depending on the conduction current. After a predetermined discharging period (or sensing period), SEN will drop to some value that may or may not turn on the measuring p-transistor 656. If it drops sufficiently low to turn on the p-transistor 656, it will mean that the conduction current is higher than the reference current. This will also result in the INV signal being pulled HIGH when the signal STB is asserted. On the other hand, if the transistor 656 is not turned on at the end of the sensing period, the conduction current is lower than the reference current and the signal INV will be LOW. Referring to FIG. 7A, the end of the sensing period is marked by decoupling the bit line from the SEN node with XXL turning off the coupling transistor 630. The sensed result is then latched into the latch 660 based on a strobe signal STB. After the sensed result has been latched, signal NCO may be used to pass the state of the sense node 481 to the readout bus 499 via transfer gate 488.

In another embodiment, a cell current discriminator circuit may include a current mirror, which mirrors the current through the bit line, and a comparator which compares the mirrored current with a reference current. In some cases, a target reference current (or target cell current) may be injected into the bit line in order to facilitate current sensing. In some cases, the cell current discriminator circuit may include a differential amplifier for comparing the voltage associated with a sensed result with a reference voltage and determining the state of a memory cell based on the comparison.

Figure 8A:
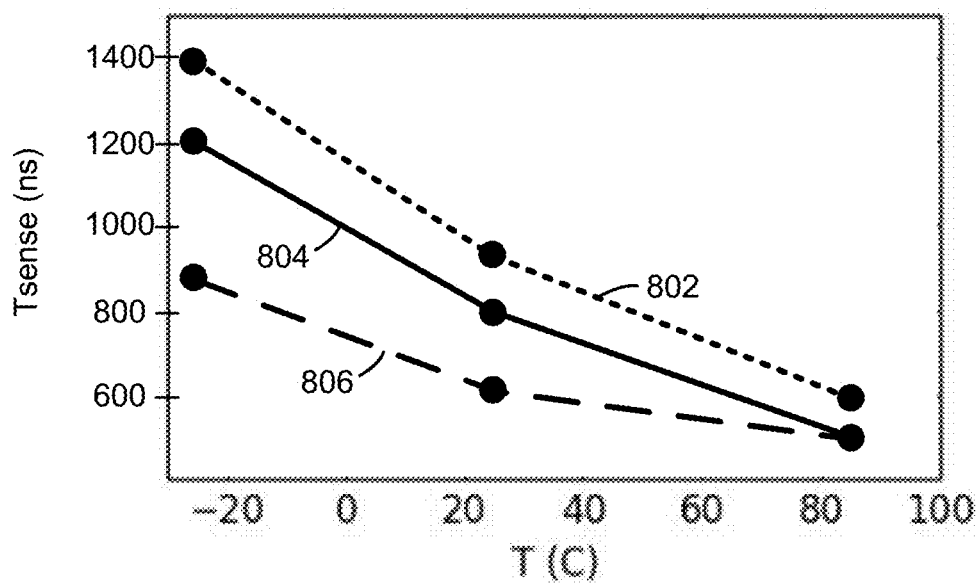
FIG. 8A depicts one embodiment of a chart showing various sensing time (Tsense) settings over read temperature.

FIG. 8A depicts one embodiment of a chart showing various sensing time (Tsense) settings over read temperature (i.e., the temperature at which memory cells may be read). As depicted, a first range of Tsense settings 804 associated with a programming temperature (i.e., the temperature associated with memory cells when the memory cells were programmed) at room temperature (e.g., 25 degrees Celsius) or within a range of room temperatures (e.g., between 10 and 65 degrees Celsius) varies from a Tsense setting of 1200 ns if the read temperature is −25 degrees Celsius to a Tsense setting of 800 ns if the read temperature is 25 degrees Celsius to a Tsense setting of 500 ns if the read temperature is 85 degrees Celsius. In this case, if control circuitry determines that a page of data was previously programmed at or near room temperature, then the control circuitry may determine the sensing time for a read operation using the first range of Tsense settings 804 (e.g., by accessing a lookup table including the first range of Tsense settings). A second range of Tsense settings 802 associated with a programming temperature at a high temperature (e.g., 85 degrees Celsius) or within a range of high temperatures (e.g., temperatures above 65 degrees Celsius) varies from a Tsense setting of 1400 ns if the read temperature is −25 degrees Celsius to a Tsense setting of 1000 ns if the read temperature is 25 degrees Celsius to a Tsense setting of 600 ns if the read temperature is 85 degrees Celsius. In this case, if control circuitry determines that a page of data was previously programmed at a temperature above 65 degrees Celsius, then the control circuitry may determine the sensing time for a read operation using the second range of Tsense settings 802. A third range of Tsense settings 806 associated with a programming temperature at a low temperature (e.g., −25 degrees Celsius) or within a range of low temperatures (e.g., temperatures below 10 degrees Celsius) varies from a Tsense setting of 900 ns if the read temperature is −25 degrees Celsius to a Tsense setting of 600 ns if the read temperature is 25 degrees Celsius to a Tsense setting of 500 ns if the read temperature is 85 degrees Celsius. In this case, if control circuitry determines that a page of data was previously programmed at a temperature below 10 degrees Celsius, then the control circuitry may determine the sensing time for a read operation using the third range of Tsense settings 806.

Figure 8B:
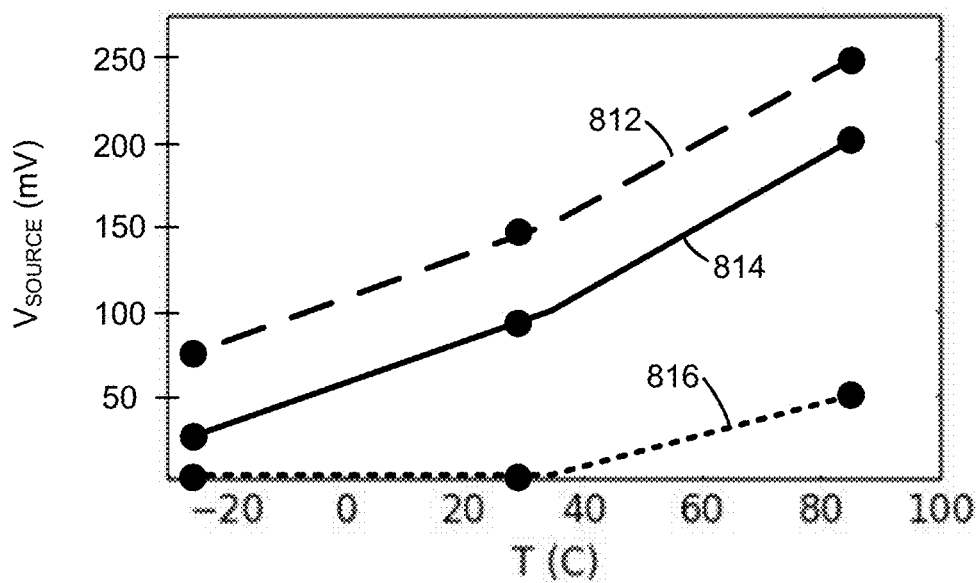
FIG. 8B depicts one embodiment of a chart showing various source line voltage ($V_{SOURCE}$) settings over read temperature.

FIG. 8B depicts one embodiment of a chart showing various source line voltage ($V_{SOURCE}$) settings over read temperature (i.e., the temperature at which memory cells may be read). As depicted, a first range of $V_{SOURCE}$ settings 814 associated with a programming temperature (i.e., the temperature associated with memory cells when the memory cells were programmed) at room temperature (e.g., 25 degrees Celsius) or within a range of room temperatures (e.g., between 10 and 65 degrees Celsius) varies from a $V_{SOURCE}$ setting of 25 mV if the read temperature is −25 degrees Celsius to a $V_{SOURCE}$ setting of 100 mV if the read temperature is 25 degrees Celsius to a $V_{SOURCE}$ setting of 200 mV if the read temperature is 85 degrees Celsius. In this case, if control circuitry determines that a page of data was previously programmed at or near room temperature, then the control circuitry may determine the source line voltage for a read operation using the first range of $V_{SOURCE}$ settings 814 (e.g., by accessing a lookup table including the first range of $V_{SOURCE}$ settings). A second range of $V_{SOURCE}$ settings 812 associated with a programming temperature at a high temperature (e.g., 85 degrees Celsius) or within a range of high temperatures (e.g., temperatures above 65 degrees Celsius) varies from a $V_{SOURCE}$ setting of 75 mV if the read temperature is −25 degrees Celsius to a $V_{SOURCE}$ setting of 150 mV if the read temperature is 25 degrees Celsius to a $V_{SOURCE}$ setting of 250 mV if the read temperature is 85 degrees Celsius. In this case, if control circuitry determines that a page of data was previously programmed at a temperature above 65 degrees Celsius, then the control circuitry may determine the source line voltage for a read operation using the second range of $V_{SOURCE}$ settings 812. A third range of $V_{SOURCE}$ settings 816 associated with a programming temperature at a low temperature (e.g., −25 degrees Celsius) or within a range of low temperatures (e.g., temperatures below 10 degrees Celsius) varies from a $V_{SOURCE}$ setting of 0 mV if the read temperature is −25 degrees Celsius to a $V_{SOURCE}$ setting of 0 mV if the read temperature is 25 degrees Celsius to a $V_{SOURCE}$ setting of 50 mV if the read temperature is 85 degrees Celsius. In this case, if control circuitry determines that a page of data was previously programmed at a temperature below 10 degrees Celsius, then the control circuitry may determine the source line voltage for a read operation using the third range of $V_{SOURCE}$ settings 816.

Figure 8C:
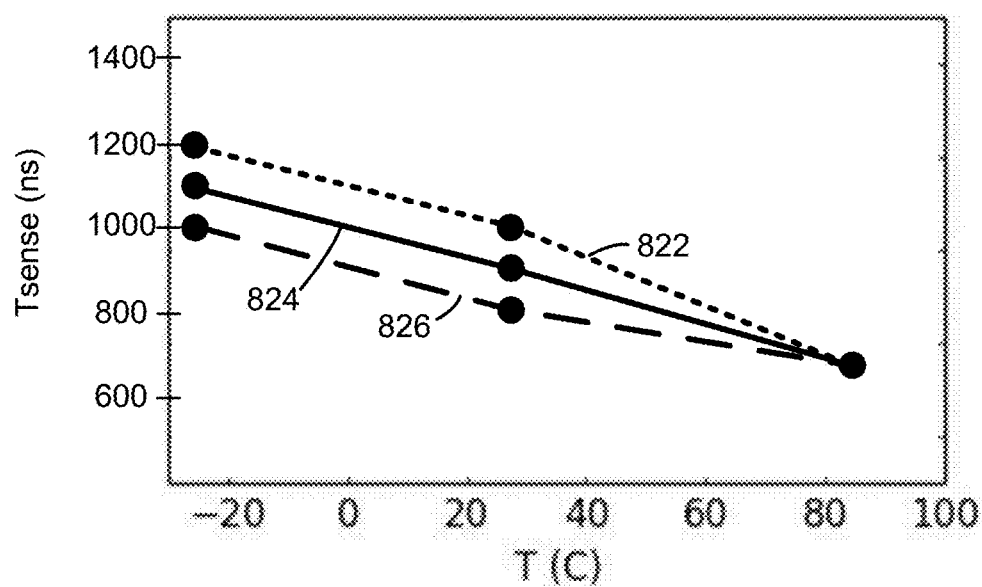
FIG. 8C depicts one embodiment of a chart showing various sensing time (Tsense) settings over read temperature.

FIG. 8C depicts one embodiment of a chart showing various sensing time (Tsense) settings over read temperature (i.e., the temperature at which memory cells may be read). As depicted, a first range of Tsense settings 824 for a set of middle word lines (e.g., word lines 6-15 of word lines 0-31 in which word line 0 is closest to a source-side select gate of a NAND string) varies from a Tsense setting of 1100 ns if the read temperature is −25 degrees Celsius to a Tsense setting of 950 ns if the read temperature is 25 degrees Celsius to a Tsense setting of 700 ns if the read temperature is 85 degrees Celsius. In this case, if control circuitry determines that a page of data to be read is associated with one of the word lines 6-15, then the control circuitry may determine the sensing time for a read operation using the first range of Tsense settings 824 (e.g., by accessing a lookup table including the first range of Tsense settings). A second range of Tsense settings 822 for a set of source-side word lines (e.g., word lines 0-5 of word lines 0-31 in which word line 0 is closest to a source-side select gate of a NAND string) varies from a Tsense setting of 1200 ns if the read temperature is −25 degrees Celsius to a Tsense setting of 1050 ns if the read temperature is 25 degrees Celsius to a Tsense setting of 700 ns if the read temperature is 85 degrees Celsius. In this case, if control circuitry determines that a page of data to be read is associated with one of the word lines 0-5, then the control circuitry may determine the sensing time for a read operation using the second range of Tsense settings 822. A third range of Tsense settings 826 for a set of drain-side word lines (e.g., word lines 16-31 of word lines 0-31 in which word line 0 is closest to a source-side select gate of a NAND string) varies from a Tsense setting of 1000 ns if the read temperature is −25 degrees Celsius to a Tsense setting of 800 ns if the read temperature is 25 degrees Celsius to a Tsense setting of 700 ns if the read temperature is 85 degrees Celsius. In this case, if control circuitry determines that a page of data to be read is associated with one of the word lines 16-31, then the control circuitry may determine the sensing time for a read operation using the third range of Tsense settings 826.

Figure 8D:
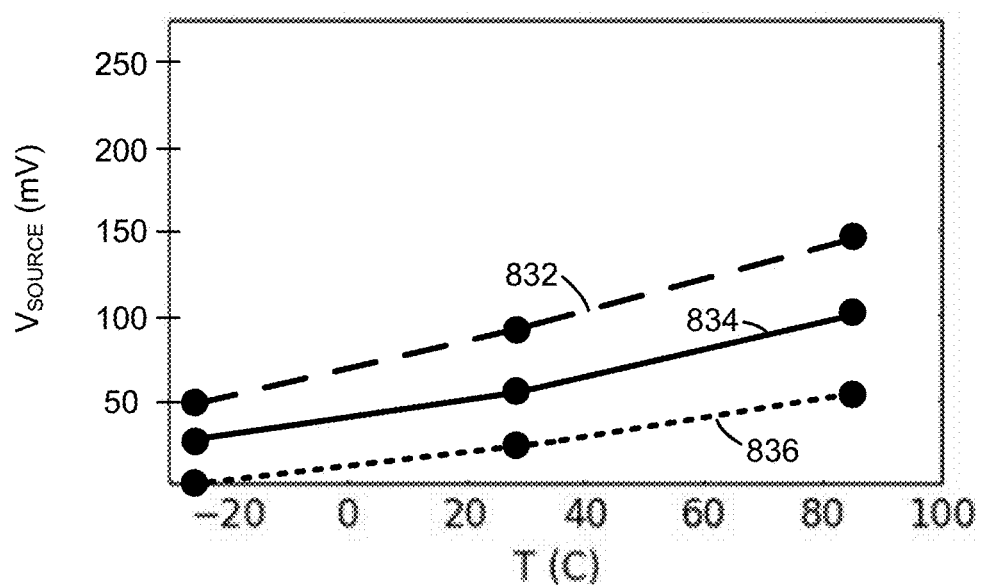
FIG. 8D depicts one embodiment of a chart showing various source line voltage ($V_{SOURCE}$) settings over read temperature.

FIG. 8D depicts one embodiment of a chart showing various source line voltage ($V_{SOURCE}$) settings over read temperature (i.e., the temperature at which memory cells may be read). As depicted, a first range of $V_{SOURCE}$ settings 834 for a set of middle word lines (e.g., word lines 6-15 of word lines 0-31 in which word line 0 is closest to a source-side select gate of a NAND string) varies from a $V_{SOURCE}$ setting of 25 mV if the read temperature is −25 degrees Celsius to a $V_{SOURCE}$ setting of 50 mV if the read temperature is 25 degrees Celsius to a $V_{SOURCE}$ setting of 100 mV if the read temperature is 85 degrees Celsius. In this case, if control circuitry determines that a page of data to be read is associated with one of the word lines 6-15, then the control circuitry may determine the source line voltage for a read operation using the first range of $V_{SOURCE}$ settings 834 (e.g., by accessing a lookup table including the first range of $V_{SOURCE}$ settings). A second range of $V_{SOURCE}$ settings 832 for a set of source-side word lines (e.g., word lines 0-5 of word lines 0-31 in which word line 0 is closest to a source-side select gate of a NAND string at a high temperature) varies from a $V_{SOURCE}$ setting of 50 mV if the read temperature is −25 degrees Celsius to a $V_{SOURCE}$ setting of 100 mV if the read temperature is 25 degrees Celsius to a $V_{SOURCE}$ setting of 150 mV if the read temperature is 85 degrees Celsius. In this case, if control circuitry determines that a page of data to be read is associated with one of the word lines 0-5, then the control circuitry may determine the source line voltage for a read operation using the second range of $V_{SOURCE}$ settings 832. A third range of $V_{SOURCE}$ settings 836 for a set of drain-side word lines (e.g., word lines 16-31 of word lines 0-31 in which word line 0 is closest to a source-side select gate of a NAND string at a high temperature) varies from a $V_{SOURCE}$ setting of 0 mV if the read temperature is −25 degrees Celsius to a $V_{SOURCE}$ setting of 25 mV if the read temperature is 25 degrees Celsius to a $V_{SOURCE}$ setting of 50 mV if the read temperature is 85 degrees Celsius. In this case, if control circuitry determines that a page of data to be read is associated with one of the word lines 16-31, then the control circuitry may determine the sensing time for a read operation using the third range of $V_{SOURCE}$ settings 836.

In one embodiment, if a plurality of memory cells are to be read at a temperature between 10 degrees Celsius and 65 degrees Celsius, then the source line voltage applied to a source line connected to a source-side end of a NAND string may be determined based on both the location of a word line connected to the plurality of memory cells (i.e., the selected word line) and the programming temperature at which the plurality of memory cells were programmed. In another embodiment, if a plurality of memory cells are to be read at a temperature above 65 degrees Celsius, then the source line voltage applied to a source line connected to a source-side end of a NAND string may be determined based on the location of a word line connected to the plurality of memory cells (e.g., whether the selected word line is located adjacent to or near a source-side select gate for the NAND string), the programming temperature at which the plurality of memory cells were programmed, and the programming voltage at which the plurality of memory cells were programmed.

In some embodiments, the sensing time for sensing a first memory cell of a plurality of memory cells and the source line voltage to be applied to a source line connected to a NAND string that includes the first memory cell may be determined based on a read temperature at which the plurality of memory cells will be read, a word line zone associated with a selected word line connected to the plurality of memory cells to be read, the programming temperature at which the plurality of memory cells were programmed previously, and the programmed data states associated with neighboring memory cells that are adjacent to the first memory cell. In one example, the sensing time may be increased by 100 ns and the source line voltage may be reduced by 50 mV if a data state associated with a second memory cell adjacent to the first memory cell is above a particular programming state (e.g., the stored threshold voltage of the second memory cell is above 6V).

Figure 8E:
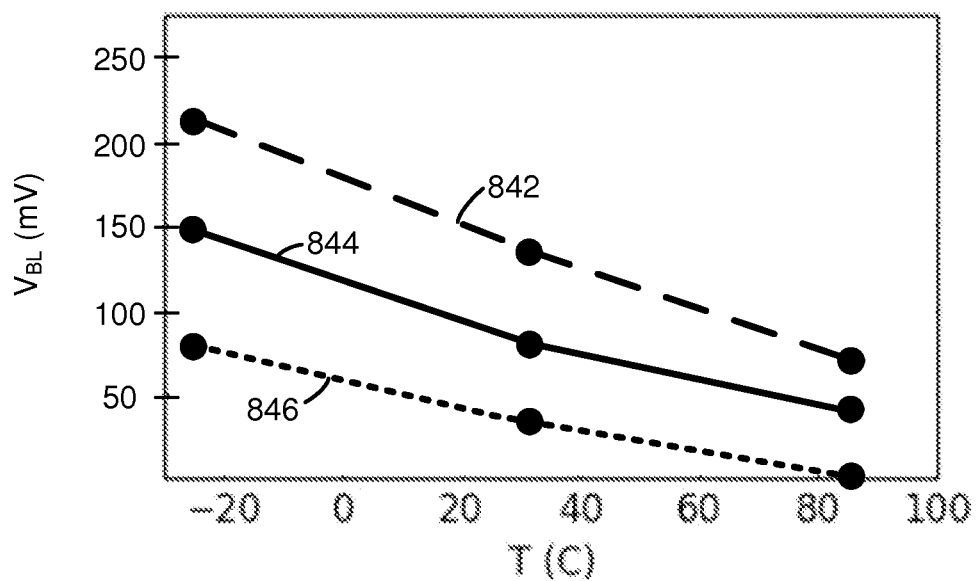
FIG. 8E depicts one embodiment of a chart showing various bit line voltage ($V_{BL}$) settings over read temperature.

FIG. 8E depicts one embodiment of a chart showing various bit line voltage ($V_{BL}$) settings over read temperature. As depicted, a first range of bit line voltage settings 844 associated with a programming temperature (i.e., the temperature associated with memory cells when the memory cells were programmed) at room temperature (e.g., 25 degrees Celsius) or within a range of room temperatures (e.g., between 10 and 65 degrees Celsius) varies from a bit line voltage setting of 150 mV if the read temperature is −25 degrees Celsius to a bit line voltage setting of 90 mV if the read temperature is 25 degrees Celsius to a bit line voltage setting of 50 mV if the read temperature is 85 degrees Celsius. In this case, if control circuitry determines that a page of data was previously programmed at or near room temperature, then the control circuitry may determine the selected bit line voltage for a read operation using the first range of bit line voltage settings 844 (e.g., by accessing a lookup table including the first range of bit line voltage settings). A second range of bit line voltage settings 842 associated with a programming temperature at a high temperature (e.g., 85 degrees Celsius) or within a range of high temperatures (e.g., temperatures above 65 degrees Celsius) varies from a bit line voltage setting of 220 mV if the read temperature is −25 degrees Celsius to a bit line voltage setting of 145 mV if the read temperature is 25 degrees Celsius to a bit line voltage setting of 90 mV if the read temperature is 85 degrees Celsius. In this case, if control circuitry determines that a page of data was previously programmed at a temperature above 65 degrees Celsius, then the control circuitry may determine the selected bit line voltage (i.e., the voltage applied to selected bit lines) for a read operation using the second range of bit line voltage settings 842. A third range of bit line voltage settings 846 associated with a programming temperature at a low temperature (e.g., −25 degrees Celsius) or within a range of low temperatures (e.g., temperatures below 10 degrees Celsius) varies from a bit line voltage setting of 90 mV if the read temperature is −25 degrees Celsius to a bit line voltage setting of 45 mV if the read temperature is 25 degrees Celsius to a bit line voltage setting of 0 mV if the read temperature is 85 degrees Celsius. In this case, if control circuitry determines that a page of data was previously programmed at a temperature below 10 degrees Celsius, then the control circuitry may determine the selected bit line voltage for a read operation using the third range of bit line voltage settings 846.

Figure 8F:
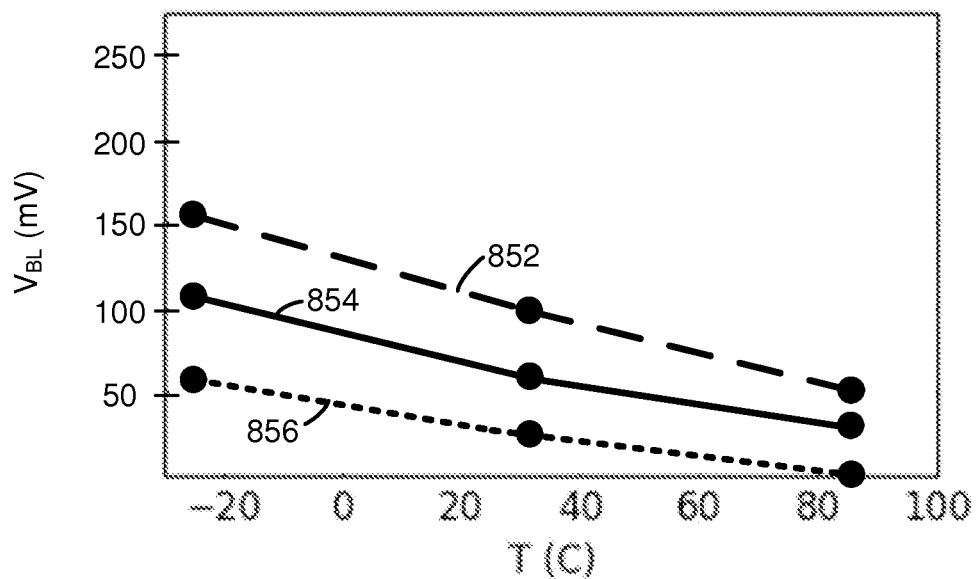
FIG. 8F depicts one embodiment of a chart showing various bit line voltage ($V_{BL}$) settings over read temperature.

FIG. 8F depicts one embodiment of a chart showing various bit line voltage ($V_{BL}$) settings over read temperature. As depicted, a first range of bit line voltage settings 854 for a set of middle word lines (e.g., word lines 6-15 of word lines 0-31 in which word line 0 is closest to a source-side select gate of a NAND string) varies from a bit line voltage setting of 110 mV if the read temperature is negative 25 degrees Celsius to a bit line voltage setting of 75 mV if the read temperature is 25 degrees Celsius to a bit line voltage setting of 40 mV if the read temperature is 85 degrees Celsius. In this case, if control circuitry determines that a page of data to be read is associated with one of the word lines 6-15, then the control circuitry may determine the selected bit line voltage (i.e., the voltage applied to selected bit lines) for a read operation using the first range of bit line voltage settings 854 (e.g., by accessing a lookup table including the first range of bit line voltage settings). A second range of bit line voltage settings 852 for a set of source-side word lines (e.g., word lines 0-5 of word lines 0-31 in which word line 0 is closest to a source-side select gate of a NAND string) varies from a bit line voltage setting of 155 mV if the read temperature is −25 degrees Celsius to a bit line voltage setting of 110 mV if the read temperature is 25 degrees Celsius to a bit line voltage setting of 75 mV if the read temperature is 85 degrees Celsius. In this case, if control circuitry determines that a page of data to be read is associated with one of the word lines 0-5, then the control circuitry may determine the selected bit line voltage for a read operation using the second range of bit line voltage settings 852. A third range of bit line voltage settings 856 for a set of drain-side word lines (e.g., word lines 16-31 of word lines 0-31 in which word line 0 is closest to a source-side select gate of a NAND string) varies from a bit line voltage setting of 60 mV if the read temperature is −25 degrees Celsius to a bit line voltage setting of 35 mV if the read temperature is 25 degrees Celsius to a bit line voltage setting of 0 mV if the read temperature is 85 degrees Celsius. In this case, if control circuitry determines that a page of data to be read is associated with one of the word lines 16-31, then the control circuitry may determine the selected bit line voltage for a read operation using the third range of bit line voltage settings 856.

Figure 9A:
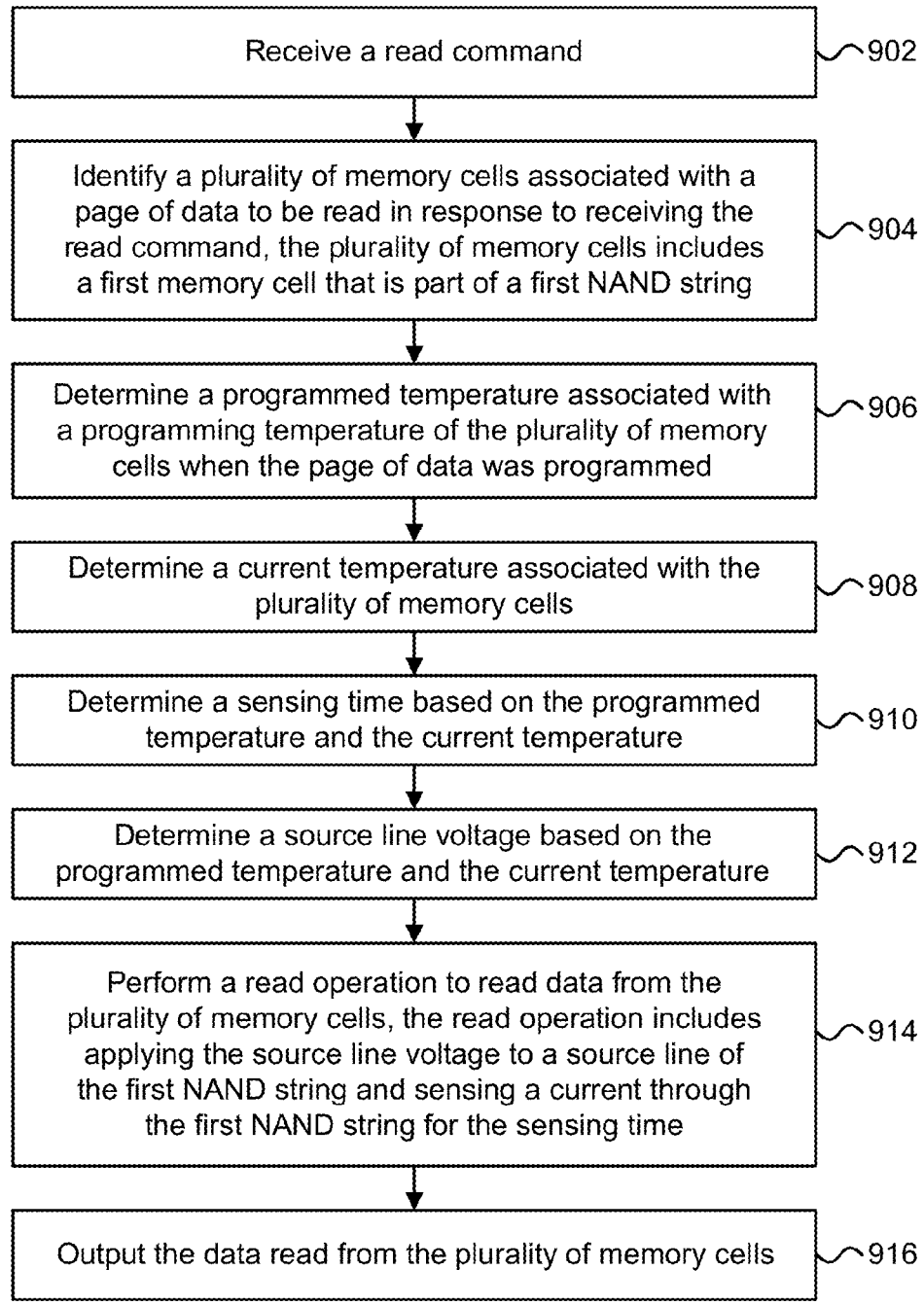
FIG. 9A is a flowchart describing one embodiment of a process for performing a read operation.

FIG. 9A is a flowchart describing one embodiment of a process for performing a read operation. In one embodiment, the process of FIG. 9A may be performed by a non-volatile storage system, such as non-volatile storage system 596 in FIG. 5.

In step 902, a read command is received. The read command may be received by a non-volatile storage system from a host device (e.g., a mobile computing device or a server). The read command may specify a memory address or a range of memory addresses to be read from the non-volatile storage system. In step 904, a plurality of memory cells associated with a page of data to be read is identified in response to receiving the read command. The plurality of memory cells may include a first memory cell that is part of a first NAND string. The first NAND string may be part of a NAND memory array. The NAND memory array may include a NAND flash memory structure, such as a vertical NAND structure or a bit cost scalable (BiCS) NAND structure. The page of data may comprise 1 KB or 2 KB of data.

In step 906, a programmed temperature associated with a programming temperature of the plurality of memory cells when the page of data was programmed is determined. In one embodiment, the programmed temperature may be acquired by reading temperature information (e.g., two bits encoding one of four temperature ranges) stored within the sideband or overhead area located at the end of the page (e.g., within an additional 16 bytes appended to the page). In one example, two temperature bits encoded within the sideband information of the page may specify one of four temperature ranges between −25 degrees Celsius and 85 degrees Celsius.

In step 908, a current temperature (or present time temperature) associated with the plurality of memory cells is determined. The current temperature may be acquired from a temperature sensor located on a memory die that includes the plurality of memory cells. The current temperature may comprise the temperature at which the plurality of memory cells will be read. In step 910, a sensing time for sensing the plurality of memory cells is determined based on the programmed temperature acquired in step 906 and the current temperature acquired in step 908. In one embodiment, the sensing time may be determined via a lookup table stored in a non-volatile memory. In step 912, a source line voltage is determined based on the programmed temperature and the current temperature. In one embodiment, the source line voltage may be determined via a lookup table stored in a non-volatile memory. In step 914, a read operation to read data from the plurality of memory cells is performed. The read operation includes applying the source line voltage to a source line of the first NAND string and sensing a current through the first NAND string for the sensing time. In step 916, the data read from the plurality of memory cells is outputted.

In one embodiment, the sensing time used during a read operation may be increased during low temperature reads in order to reduce cross-temperature threshold voltage widening. Similarly, the sensing time may be decreased during high temperature reads in order to reduce cross-temperature threshold voltage widening. The sensing voltage (or read voltage) applied to a bit line during a read operation may be increased during low temperature reads in order to reduce cross-temperature threshold voltage widening. Similarly, the sensing voltage applied to a bit line during a read operation may be decreased during high temperature reads in order to reduce cross-temperature threshold voltage widening.

Figure 9B:
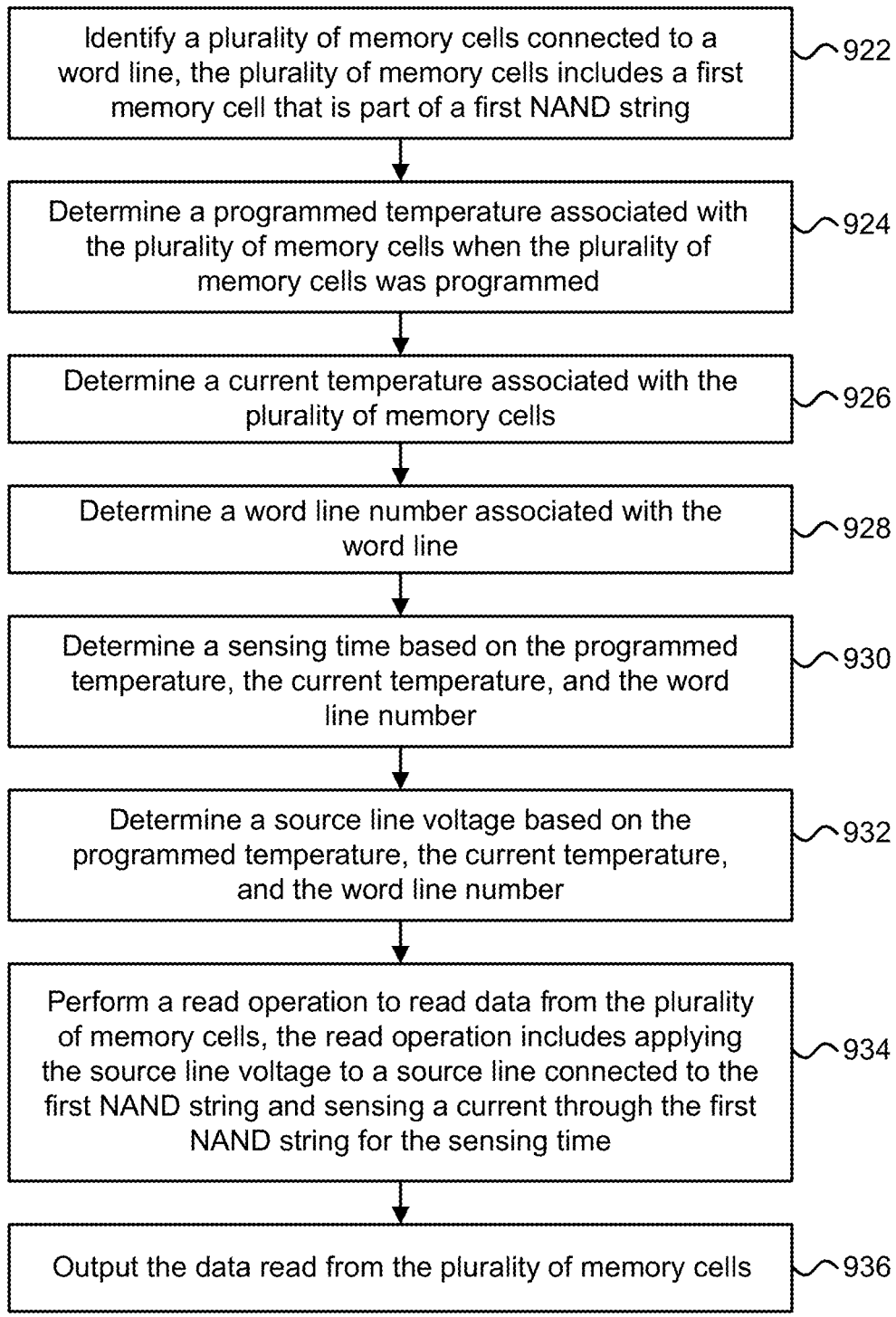
FIG. 9B is a flowchart describing an alternative embodiment of a process for performing a read operation.

FIG. 9B is a flowchart describing an alternative embodiment of a process for performing a read operation. In one embodiment, the process of FIG. 9B may be performed by a non-volatile storage system, such as non-volatile storage system 596 in FIG. 5.

In step 922, a plurality of memory cells connected to a word line is identified. The word line may comprise a selected word line within a memory array. The memory array may comprise a NAND flash memory structure, such as a vertical NAND structure or a bit cost scalable (BiCS) NAND structure. The plurality of memory cells may include a first memory cell that is part of a first NAND string. In step 924, a programmed temperature associated with the plurality of memory cells when the plurality of memory cells was programmed is determined. In one embodiment, the programmed temperature may be acquired by reading temperature information (e.g., four bits encoding one of sixteen temperature ranges) stored within the sideband or overhead area located at the end of the page (e.g., within an additional 16 bytes appended to the page).

In step 926, a current temperature associated with the plurality of memory cells is determined. The current temperature may be acquired from a temperature sensor located on a memory die that includes the plurality of memory cells. The current temperature may comprise the temperature at which the plurality of memory cells will be read. In step 928, a word line number associated with the word line is determined. The word line number may correspond with a location of the word line between a source-side end of the first NAND string and a drain-side end of the first NAND string.

In step 930, a sensing time is determined based on the programmed temperature, the current temperature, and the word line number. In some cases, the sensing time may be determined based on the programmed temperature, the current temperature, and a word line zone that includes the word line (e.g., a source-side word line zone). In step 932, a source line voltage is determined based on the programmed temperature, the current temperature, and the word line number. In step 934, a read operation to read data from the plurality of memory cells is performed. The read operation includes applying the source line voltage to a source line connected to a source end of the first NAND string and sensing a current through the first NAND string for the sensing time. In step 936, the data read from the plurality of memory cells is outputted. In one example, the data read from the plurality of memory cells may be outputted to a host device.

In some embodiments, the sensing time applied during a read operation may be determined and applied on a per bit line basis based on the read temperature at which a plurality of memory cells will be read, the programmed temperature at which the plurality of memory cells was programmed, and a location of a memory cell within a NAND string connected to a bit line (e.g., whether the memory cell is located adjacent to or near the source-side select gate of the NAND string or whether the memory cell is located adjacent to or near the drain-side select gate of the NAND string). The sensing voltage (or read voltage) applied to a bit line connected to the NAND string and the amount of integration capacitance that is charged or discharged during the sensing time may also be set based on the read temperature, the programmed temperature, and the location of the memory cell within the NAND string.

One embodiment of the disclosed technology includes a plurality of memory cells in communication with one or more control circuits. The plurality of memory cells includes a first memory cell that is part of a first NAND string. The one or more control circuits configured to determine a location of the first memory cell within the first NAND string and configured to determine a read temperature at which the plurality of memory cells will be read. The one or more control circuits configured to determine a sensing time based on the location of the first memory cell and the read temperature and configured to determine a source line voltage based on the location of the first memory cell and the read temperature. The one or more control circuits configured to initiate a read operation to read data from the plurality of memory cells. The source line voltage is applied to a source line of the first NAND string during the read operation and a current through the first NAND string is sensed for the sensing time during the read operation.

One embodiment of the disclosed technology includes identifying a plurality of memory cells to be read. The plurality of memory cells includes a first memory cell that is part of a first NAND string. The method further comprises determining a location of the first memory cell within the first NAND string, determining a read temperature at which the plurality of memory cells will be read, determining a sensing time based on the location of the first memory cell and the read temperature, determining a source line voltage based on the location of the first memory cell and the read temperature, and performing a read operation to read data from the plurality of memory cells. The read operation includes applying the source line voltage to a source line of the first NAND string and sensing a current through the first NAND string for the sensing time.

One embodiment of the disclosed technology includes a plurality of memory cells in communication with one or more control circuits. The plurality of memory cells includes a first memory cell that is part of a first NAND string. The one or more control circuits configured to identify a word line connected to the plurality of memory cells and configured to determine a word line zone that includes the word line. The one or more control circuits configured to determine a sensing temperature at which the plurality of memory cells will be sensed. The one or more control circuits configured to determine a sensing time based on the word line zone and the sensing temperature and configured to determine a source line voltage based on the word line zone and the sensing temperature. The one or more control circuits configured to determine a threshold voltage of the first memory cell during a sensing operation. The source line voltage is applied to a source line of the first NAND string during the sensing operation and a current through the first NAND string is sensed for the sensing time during the sensing operation.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A non-volatile storage system, comprising:
a plurality of memory cells, the plurality of memory cells includes a first memory cell that is part of a first NAND string; and
one or more control circuits in communication with the plurality of memory cells, the one or more control circuits configured to determine a location of the first memory cell within the first NAND string and configured to determine a read temperature at which the plurality of memory cells will be read, the one or more control circuits configured to determine a source line voltage based on the location of the first memory cell and the read temperature, the one or more control circuits configured to initiate a read operation to read data from the plurality of memory cells, the source line voltage is applied to a source line of the first NAND string during the read operation.

2. The non-volatile storage system of claim 1, wherein:
the one or more control circuits configured to determine a sensing time based on the location of the first memory cell and the read temperature, a current through the first NAND string is sensed for the sensing time during the read operation.

3. The non-volatile storage system of claim 1, wherein:
the one or more control circuits configured to determine a bit line voltage to be applied to a bit line connected to the first NAND string based on a programmed temperature of the plurality of memory cells at which the data was programmed into the plurality of memory cells and the read temperature, the bit line voltage is applied to the bit line during the read operation.

4. The non-volatile storage system of claim 2, wherein:
the one or more control circuits configured to determine a neighboring data state of a second memory cell that is adjacent to the first memory cell, the one or more control circuits configured to determine the sensing time based on the neighboring data state.

5. The non-volatile storage system of claim 2, wherein:
the one or more control circuits configured to determine a programming voltage applied to the plurality of memory cells when the data was programmed into the plurality of memory cells; and
the one or more control circuits configured to determine the sensing time based on the programming voltage.

6. The non-volatile storage system of claim 2, wherein:
the one or more control circuits configured to determine an integration capacitance value to be used during the sensing time based on the location of the first memory cell and the read temperature, the current through the first NAND string discharges an integration capacitor of the integration capacitance value during the sensing time.

7. The non-volatile storage system of claim 2, wherein:
the data comprises a page of data, the one or more control circuits configured to determine a programmed temperature of the plurality of memory cells at which the data was programmed into the plurality of memory cells and determine the sensing time based on the programmed temperature, the one or more control circuits configured to acquire temperature information from an overhead area associated with the page of data and configured to determine the programmed temperature based on the temperature information.

8. The non-volatile storage system of claim 7, wherein:
the one or more control circuits configured to reduce the source line voltage if the read temperature is less than the programmed temperature.

9. The non-volatile storage system of claim 1, wherein:
the plurality of memory cells are part of a memory array, the memory array is monolithically formed in one or more physical levels of memory cells having active areas disposed above a silicon substrate.

10. The non-volatile storage system of claim 1, wherein:
the plurality of memory cells are part of a three-dimensional memory array.

11. A method for operating a non-volatile storage system, comprising:
identifying a plurality of memory cells to be read, the plurality of memory cells includes a first memory cell that is part of a first NAND string;
determining a location of the first memory cell within the first NAND string;
determining a read temperature at which the plurality of memory cells will be read;
determining a source line voltage based on the location of the first memory cell and the read temperature; and
performing a read operation to read data from the plurality of memory cells, the read operation includes applying the source line voltage to a source line of the first NAND string.

12. The method of claim 11, further comprising:
determining a sensing time based on the location of the first memory cell and the read temperature, the read operation includes sensing a current through the first NAND string for the sensing time.

13. The method of claim 11, further comprising:
determining a programmed temperature of the plurality of memory cells at which the data was programmed into the plurality of memory cells;
determining a sensing time based on the programmed temperature, the determining the source line voltage includes determining the source line voltage based on the programmed temperature; and
determining a bit line voltage to be applied to a bit line connected to the first NAND string based on the programmed temperature and the read temperature, the read operation includes applying the bit line voltage to the bit line during the sensing time.

14. The method of claim 12, further comprising:
determining a neighboring data state of a second memory cell that is adjacent to the first memory cell, the determining a sensing time includes determining the sensing time based on the neighboring data state.

15. The method of claim 12, further comprising:
determining a programming voltage applied to the plurality of memory cells when the data was programmed into the plurality of memory cells; and
the determining a sensing time includes determining the sensing time based on the programming voltage.

16. The method of claim 12, further comprising:
determining an integration capacitance value to be used during the sensing time based on the location of the first memory cell and the read temperature, the read operation includes discharging an integration capacitor of the integration capacitance value during the sensing time using the current through the first NAND string.

17. The method of claim 11, wherein:
the determining a read temperature includes acquiring the read temperature from a temperature sensor prior to performing the read operation.

18. The method of claim 13, wherein:
the determining the source line voltage includes reducing the source line voltage if the read temperature is less than the programmed temperature.

19. The method of claim 11, wherein:
the plurality of memory cells are part of a memory array, the memory array is monolithically formed in one or more physical levels of memory cells having active areas disposed above a silicon substrate.

20. An apparatus, comprising:
a memory array, the memory array includes a memory cell that is part of a NAND string; and
one or more control circuits configured to determine a location of the memory cell within the NAND string and determine a source line voltage based on the location of the memory cell within the NAND string and a read temperature at which the memory cell will be read, the one or more control circuits configured to set a source line of the NAND string to the source line voltage while the data is read from the memory cell.

* * * * *